United States Patent [19]

Toyama et al.

[11] 4,191,573

[45] Mar. 4, 1980

[54] PHOTOSENSITIVE POSITIVE IMAGE FORMING PROCESS WITH TWO PHOTO-SENSITIVE LAYERS

[75] Inventors: Tadao Toyama, Shizuoka; Masayuki Iwasaki, Minami-ashigara, both of Japan

[73] Assignee: Fuji Photo Film Co., Ltd., Minami-ashigara, Japan

[21] Appl. No.: 887,911

[22] Filed: Mar. 17, 1978

Related U.S. Application Data

[63] Continuation of Ser. No. 621,104, Oct. 9, 1975, abandoned.

[30] Foreign Application Priority Data

Oct. 9, 1974 [JP] Japan .................. 49/116907

[51] Int. Cl.$^2$ .................. G03F 7/08; G03C 1/54
[52] U.S. Cl. .................. 430/166; 430/167; 430/302
[58] Field of Search .................. 96/91 D, 91 N, 75.93, 96/33, 36, 36.2, 68

[56] References Cited

U.S. PATENT DOCUMENTS

| | | | |
|---|---|---|---|
| 2,692,826 | 10/1954 | Neugebauer et al. | 96/91 N |
| 2,702,243 | 2/1955 | Schmidt | 96/75 |
| 2,848,328 | 8/1958 | Hepher | 96/91 N |
| 2,852,379 | 9/1958 | Hepher et al. | 96/91 N |
| 3,046,120 | 7/1962 | Schmidt et al. | 96/33 |
| 3,092,494 | 6/1963 | Sus et al. | 96/91 N |
| 3,143,417 | 8/1964 | Reichel et al. | 96/75 |
| 3,174,860 | 3/1965 | Sus et al. | 96/75 |
| 3,201,239 | 8/1965 | Neugebauer et al. | 96/36 |
| 3,231,381 | 1/1966 | Dickinson et al. | 96/75 |
| 3,245,792 | 4/1966 | Reichel et al. | 96/36.4 |
| 3,313,626 | 4/1967 | Whitney | 96/33 |
| 3,479,182 | 11/1969 | Chu | 96/75 |
| 3,515,547 | 6/1970 | Allentoff et al. | 96/75 |
| 3,522,042 | 7/1970 | Borchers et al. | 96/68 |
| 3,526,504 | 9/1970 | Celeste | 96/91 N |
| 3,586,507 | 6/1971 | Burnett | 96/75 |
| 3,615,475 | 10/1971 | Skaruinko | 96/68 |
| 3,617,278 | 11/1971 | Holstead et al. | 96/91 N |
| 3,649,283 | 3/1972 | Christensen et al. | 96/91 D |
| 3,651,170 | 3/1972 | Silver | 96/93 |
| 3,666,473 | 5/1972 | Colom et al. | 96/91 D |
| 3,715,210 | 2/1973 | Watkinson et al. | 96/75 |
| 3,728,115 | 4/1973 | Poot et al. | 96/91 N |
| 3,751,257 | 8/1973 | Dahlman | 96/91 R |
| 3,765,894 | 10/1973 | Mellar | 96/75 |
| 3,775,113 | 11/1973 | Bonham et al. | 96/75 |
| 3,779,758 | 12/1973 | Polichette | 96/91 N |
| 3,785,821 | 1/1974 | Notley | 96/75 |
| 3,808,004 | 4/1974 | Thomas et al. | 96/68 |
| 3,850,646 | 11/1974 | Wagner et al. | 96/75 |
| 3,905,815 | 9/1975 | Bonham | 96/68 |
| 3,982,943 | 9/1976 | Ferg et al. | 96/68 |
| 3,984,250 | 10/1976 | Holstead et al. | 96/91 N |

*Primary Examiner*—Charles L. Bowers, Jr.
*Attorney, Agent, or Firm*—Sughrue, Rothwell, Mion, Zinn and Macpeak

[57] ABSTRACT

A photosensitive image forming element comprising: a support; photosensitive layer therein which is rendered alkali-soluble upon exposure and which comprises (i) an azide compound having at least one alkali-soluble group in its molecular structure, and (ii) a polyamide.

12 Claims, No Drawings

PHOTOSENSITIVE POSITIVE IMAGE FORMING PROCESS WITH TWO PHOTO-SENSITIVE LAYERS

This is a continuation of application Ser. No. 621,104, filed Oct. 9, 1975, now abandoned.

BACKGROUND OF THE INVENTION

1. Field of the Invention

This invention relates to photographic image forming members, more particularly, to posi-type photosensitive members having a photosensitive layer comprising an azide compound containing in its molecular structure an alkali-soluble group.

2. Description of the Prior Art

Photosensitive compositions for posi-type image forming materials which have been conventionally used include those based on an o-quinone diazide compound, a reaction product between a photosensitive diazonium salt and a heteropolyacid, etc. However, only a few of them have been commercially used except for those based on o-quinone diazides.

As is well known in the art, an o-quinone diazide (which contains in its molecular structure the following unit as a photosensitive functional group) decomposes, when exposed to light, to form an alkali-soluble group according to the following mechanism. See O. Süs, Liebigs Annalen der Chemie, Vol. 556, p. 65 (1944).

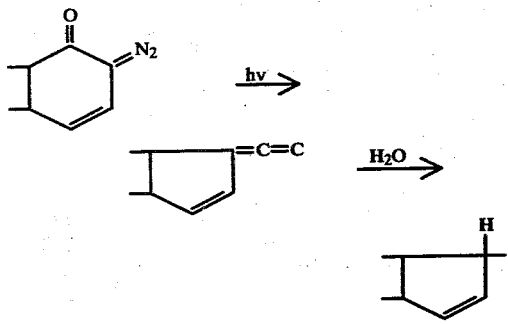

Such an o-quinone diazide can be used alone or mixed with other alkali-soluble resinous materials such as phenolformaldehyde resins, copolymers of styrene and maleic anhydride, etc., to improve image durability, the film-forming property of the composition, etc. This compound can be more advantageously used in a homogeneous composition in combination with other additives such as a dyestuff, plasticizer, etc.

However, a resinous material which is blended to raise image durability must not only be compatible with the o-quinone diazide compound but also soluble in an aqueous alkaline developer solution. Since these requirements restrict the range of resin selection, for example, the latter excluding resins such as polyamides, which are insoluble in an alkaline solution, resinous materials used to improve image durability have been limited.

In the past, azide compounds have been used as a photo cross-linking agent which decomposes upon exposure to active radiation to effect cross-linking or dimerization, and such have been widely used for nega-type photosensitive compositions. On the other hand, there have only been a few examples where azide compounds have been utilized in posi-type compositions. One example is given in "Light Sensitive Systems" by J. Kosar (John Wiley & Sons, Inc.) p.333, in which an azide compound having an alkoxy group is used which forms a photodecomposition product of greater solubility than the original compound in a dilute alkali, thus being used for posi-type printing plate.

SUMMARY OF THE INVENTION

Therefore, a principal object of the present invention is to provide a photosensitive image forming material which provides an image of excellent mechanical strength.

Another object of the invention is to provide a posi-type photosensitive material comprising a polyamide resin ingredient which provides a very tough layer.

Yet another object of the present invention is to provide a posi-type photosensitive element comprising a support having coated thereon a photosensitive material comprising a polyamide resin ingredient which provides an extremely tough layer and which provides an image of excellent mechanical strength.

After extensive investigations to reach the above objects, we discovered that a photosensitive layer comprising an azide compound having an alkali-soluble functional group and a polyamide compound can be used as a posi-type photosensitive material.

DETAILED DESCRIPTION OF THE INVENTION

The present invention provides a posi-type photosensitive image forming material comprising an azide having an alkali-soluble group such as a sulfonic acid group, a carboxylic acid group or a hydroxyl group while the mechanism is not entirely clear yet as to how such a system works as a posi-type photo material, it is believed that photodecomposition of the azide introduces alkali-soluble groups into the polyamide, thus rendering the polyamide susceptible to alkali.

This is in important point in the present invention, as it means that the polyamides utilized in the present invention are not especially limited, so long as the polyamide-containing system is one which becomes alkali-soluble upon exposure. It is the differing alkali-solubility between exposed and unexposed areas which enables one to utilize the elements of the present invention in the positive-working mode.

In the present invention, a photosensitive coating comprising an azide and a polyamide as set forth hereinbefore can be overcoated onto another photosensitive coating comprising an o-quinone diazide compound, if desired, thus enabling a further improvement in developing capability as well as image quality. At the same time, one can obtain an extremely durable image which is unattainable by the use of a conventional o-quinone diazide photosensitive coating alone.

Various support materials can be utilized in the present invention, including metal plates such as zinc, aluminum (including aluminum alloys such as alloys of predominantly aluminum with Si, Cu, Mn, Mg, Cr, Zn, etc.), or copper, plastic films such as nitrocellulose, cellulose diacetate, cellulose triacetate, cellulose butyrate, cellulose acetobutyrate, polyethylene terephthalate, polystyrene, polycarbonate, polyethylene, polypropylene, polyvinyl acetate, etc., paper, paper laminated with polyethylene or polystyrene, etc., glass, etc.

There is no special limitation on the support used in the present invention and, essentially, the support can be freely selected from those utilized in the art depending upon the end-use requirements of the material being prepared. The criteria to be applied in selecting an appropriate support will be obvious to one skilled in the art.

Preferred aluminum alloys as are mentioned above include (using the nomenclature standards of the Aluminum Association of America) alloy 2S containing 0.4% Si, 0.6% Mg, AA1100, 3S containing 1.2% Mn and AA3003, 24 S containing Cu, Mn and Mg at 4.5, 0.6 and 1.5%, respectively 52 S containing 2.5% Mg and 0.25% Cr, 61 S containing Si, Cu, Mg and Cr at 0.6, 0.25, 1.0 and 1.25% levels, respectively, and 75 S containing Cu, Mg, Cr and Zn at 1.60, 2.50, 0.30 and 5.60% levels, respectively, all percentages being weight percent and the balance being aluminum.

In the special case where the photosensitive imaging member of the present invention is used as a photosensitive lithographic printing plate, the surface of the support should be hydrophilic, in which case the most preferred support is an aluminum plate. Such an aluminum plate is preferably surface-treated, e.g., mechanically surface treated by glass bead graining, ball graining, sand blasting, brush graining as described in Japanese Patent Application (OPI) 33411/73, or by electrolytic graining, or chemical treatment with an aqueous solution of an alkali metal salt of phosphoric acid (2-20% sodium tertiary phosphate (Na₃PO₄) aqueous solution at 50-80° C. for 30 seconds to 5 minutes), a silicate or potassium fluorozirconate (e.g, with a 0.3 to 10% potassium fluorozirconate aqueous solution at 65° C. for 1 to 3 minutes), etc., or anodic oxidation using the aluminum plate as an anode (e.g., using an aqueous or solvent based acid such as sulfuric acid, oxalic acid, boric acid, phosphoric acid, sulfamic acid, chromic acid, etc., at a 1-80% wt%, concentration, an electrolyte temperature 5-70° C., a current density of 0.5-60 A/dm², a voltage of 1-100V and a time of 30 seconds to 50 minutes).

An aluminum plate which has been treated with an aqueous sodium silicate solution (e.g., by immersion into a 2 to 5 wt% sodium silicate aqueous solution at 70° C. to 90° C. for 1 to 2 minutes) after graining as described in U.S. Pat. No. 2,714,066, or one which has been anodically oxidized and further treated with an aqueous alkali metal silicate solution (e.g., in the same manner as disclosed above), as described in Japanese Patent Publication 5125/72, can also be use in the present invention for such purposes.

The azide compound used in the present invention has at least one alkali-soluble group in its molecule and, although not limitative, most preferably no more than 3 alkali-soluble groups in its molecule. Such an alkali-soluble group is typically a sulfonic acid, carboxylic acid or hydroxyl group, which can be also in the form of a salt thereof such as with an alkali metal salt, e.g., Na, K, Li, etc. Among the azides, aryl azides are most stable and are most preferred.

The aryl azides used most preferably contain one or two aryl groups, e.g.,

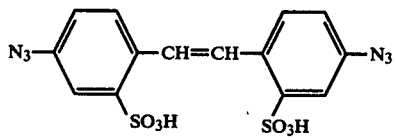

or

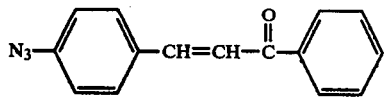

It is preferred that the maximum number of the azide groups present be 2.

Additional typical examples of preferred azide compounds are set forth below.

4,4'-diazidostilbene-2,2'-disulfonic acid

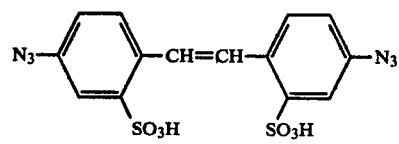

4'-azidobenzalacetophenone-2-sulfonic acid

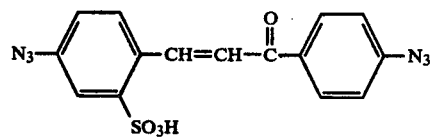

4,4'-diazidostilbene-α-carboxylic acid

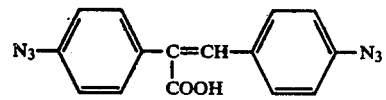

di-(4-azido-2'-hydroxybenzal)acetone-2-sulfonic acid

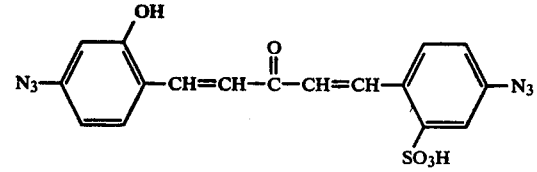

4-azidobenzalacetophenone-2-sulfonic acid

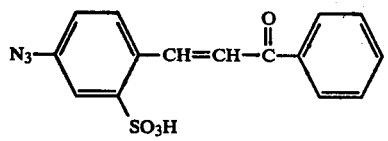

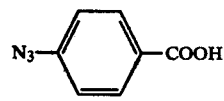

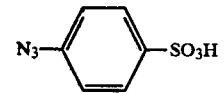

and the salts thereof with Na, K, or Li.

For photodecomposition of the azide, there can be used, if desired, appropriate sensitizers which include acenaphthene, pyrene, acrydone, anthraquinone, naphthoquinone, derivatives of nitro compounds such as 1-nitroanthraquinone, 1-nitropyrene, 1-nitroacrydone, etc., or thiazoline derivatives set forth in U.S. Pat. No. 2,948,610. A suitable amount of the sensitizer is from 3 to 30% of the weight of the azide compound.

For example, if the aryl azides are used, typical azide-sensitizer combinations are:

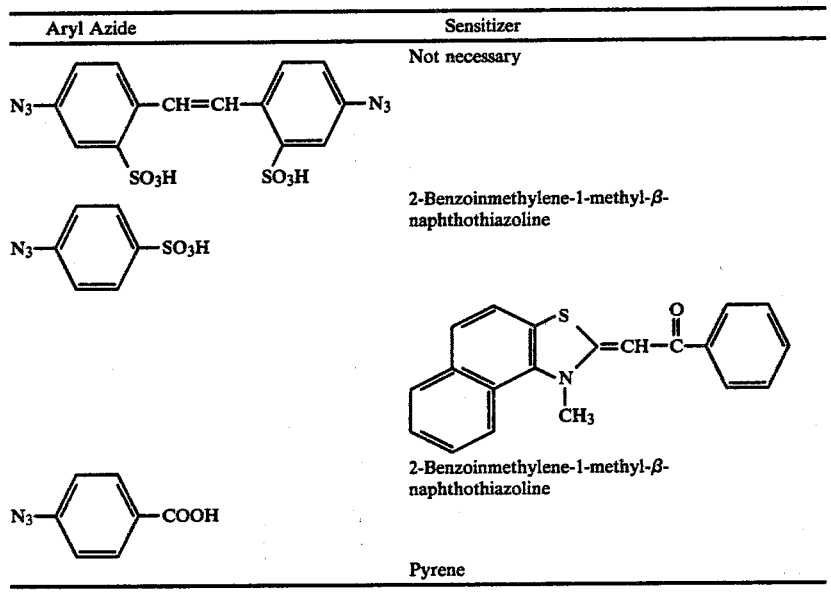

| Aryl Azide | Sensitizer |
| --- | --- |

The polyamides are preferably soluble in a common solvent for the azide compounds and form a homogeneous film from a solution therewith after drying; in other words, those polyamides highly compatible with the azides are preferred. Such polyamides include those soluble in a lower alcohol such as methanol, ethanol, n-propanol, isopropanol, butanol, etc. Suitable examples are polymers or copolymers of caprolactam, the hexamethylene diamine salt of adipic acid, the hexamethylene diamine salt of sebacic acid, etc. Such polyamides are commercially available, for example, under the trade name "Elvamide" 8061, 8062 and 8063, which are alcohol soluble, colorless and transpatent, flexible, abrasion resistant and weather resistant having the following physical properties.

| | ELVAMIDE (Trade Name) | | | |
| --- | --- | --- | --- | --- |
| | ASTM Method | 8061 | 8062 | 8063 |
| Melting point; Fischer, Jones. | D789 | 149–160° C. | 141–149° C. | 157° C. |
| Molecular Weight | | 20,000 | 20,000 | 20,000 |
| Density (73° F.) | D742 | 1.08 | 1.08 | 1.08 |
| Moisture absorption (% 24 hr.) | D570 | 2.0 | 2.3 | 3.0 |
| Rockwell hardness | D785 | R83 | R45 | R14 |
| Tensile strength (73° F.) | D638 | 7,400 psi | 5,000 psi | 3,100 psi |
| Elongation (73° F.) | D638 | 300% | 300% | >650% |

Additional preferred polyamide compounds include nylon copolymers, particularly, nylon 6- nylon 6, 10- nylon 6,6 copolymers, which are, in general, alcohol soluble. Also particularly preferred are conventional copolymers of 6-caprolactam, hexamethylenediamine, adipic acid, and sebacic acid or 6-amino caproic acid, hexamethylenediammonium adipate, hexamethylenediammonium sebacate; or N-alkoxymethyl modified nylons produced by reacting a nylon with formaldehyde and an alcohol to substitute a hydrogen atom of the amide group of the nylon as in the reaction illustrated below:

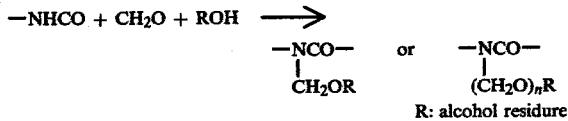

R: alcohol residure such as N-methoxymethyl polyhexamethyleneadipamide (hexamethylenediamine+adipic acid paraformaldehyde).

The polyamides as disclosed in British Patent No. 826,272 are also particularly useful in the present invention. This British Patent is hereby incorporated by reference.

Though image formation is possible when the amount of the azide compound is from about 3 to about 30% by weight based on the polyamide resin used, a more prefered range is from 5 to 15% by weight. When amounts of the azide compound substantially less than about 3% are utilized, positive images cannot be obtained. On the other hand, when amounts of the azide substantially an excess of 30% by weight are utilized both exposed areas and non-exposed areas become alkali-soluble.

As indicated earlier, however, the most important criterion which the polyamides utilized in the present invention must illustrate is that upon exposure they coact in some manner with the azide compound, whereby exposed areas are rendered alkali-soluble and unexposed areas remain alkali-insoluble. Suitable polyamides can be chosen by a relatively simple test, i.e., an amount of azide compound is blended with the polyamide within the proportions set forth in the proceeding paragraph, the system is exposed and thereafter alkali-development is conducted, for example, with an aqueous sodium hydroxide solution or the like. Preferred polyamides are capable of sharply defined removal in exposed areas upon alkali-development.

Most preferred polyamides as are utilized in the present invention have a molecular weight from about 1,000 to about 50,000, but this is not limitative on the invention as polyamides with lower and higher molecular weights can be used, though with lower molecular weights occasionally alkali-development of exposed areas does not provide an image as sharp as would be desired and with polyamides of a higher molecular weight occasionally exposed areas are removed only at a relative slow rate, requiring increased processing times.

The photosensitive composition of the present invention is dissolved in a suitable solvent or solvent system for azides and polyamides comprising, for example, a lower alkanol such as methyl alcohol, ethyl alcohol, n-proply alcohol, iso-propyl alcohol, butyl alcohol, dimethylformamide, etc. To the composition one can add suitable amounts of various organic or inorganic additives, if desired. Such additives include coloring materials such as an oil-soluble dye (e.g., Crystal Violet) and/or a pigment (e.g., phthalocyanine) to color the resulting coating, fillers to raise the physical strength of the coating such as titanium dioxide, clay or calcium carbonate, or plasticizers. Coloring materials are usually added in an amount of about 0.5 to about 10% by weight based on the polyamide resin, fillers are generally added in an amount of about 1 to 10% by weight based on the polyamide resin, and plasticizers (such as octyl p-oxybenzoate and N-butyl benzenesulfonamide) are added in an amount of about 3 to 30% by weight of the polyamide. These additives perform their art-recognized functions and, as should be apparent to one skill in the art, can be replaced by other conventional additives of a similar nature.

The photosensitive layer should preferably have a thickness of 0.01–5.0 g/m$^2$, more preferably of from 0.02 g/m$^2$ to 3.0 g/m$^2$, on a dry basis, in the single layer embodiment of the present invention.

The o-quinone diazide compounds optionally used in the photosensitive material of the present invention must have at least one o-quinone diazide group and must show increased solubility to alkali when exposed to active radiation such as, for example, radiation from a mercury lamp, xenon lamp, a carbon arc lamp or the like. One can use a variety of compounds such as are described in detail in U.S. Pat. No. 2,663,640 and in "Light Sensitive Systems" by J. Kosar (John Wiley & Sons, Inc.) at pp. 339–352. Particularly preferred compounds are sulfonic acid esters derived from aromatic polyhydroxy compounds and o-quinone diazides, as exemplified in Example 2. Suitable aromatic polyhydroxy compounds include hydroquinone, catechol, 2,2'-dihydroxybiphenyl, 4,4'-dihydroxybiphenyl, 4,4'-dihydroxydiphenyl ether, 4,4'-dihydroxydiphenyl sulfide, 4,4'-dihydroxydiphenyl sulfone, 4,4'-dihydroxydiphenylmethane, bis-phenol A, 1,8-dihydroxynaphthalene, 2,7-dihydroxynaphthalene, 1,4-dihydroxynaphthalene, 2,3-dihydroxynaphthalene, 2,2'-dihydroxy-1,1'-dinaphthylmethane, 4,4'-dihydroxybenzophenone, α,β-bis-(4-hydroxyphenyl)ethane, 1,4-dihydroxyanthraquinone, 2,7-dihydroxyfluorene, pyrogallol, methyl gallate, 2,2',4,4'-tetrahydroxybiphenyl, tetrahydroxybenzophenone, etc.

Specific examples of sulfonic acid esters derived from aromatic polyhydroxy compounds and o-quinone diazides include 2,2'-dihydroxy-diphenyl-bis-(naphthoquinone-1,2-diazide, 5-sulfonic acid ester), 2,3,4-trioxybenzophenone-bis(naphthoquinone-1,2-diazide-5-sulfonic acid ester), 2,7-dihydroxynaphthalene-bis-(naphthoquinone-1,2-diazide-5-sulfonic acid ester), an ester comprising a phenol-formaldehyde resin and naphthoquinone-1,2-diazide-5-sulfonic acid, etc. A particularly suitable compound is the naphthoquinone-1,2-diazide-5-sulfonic acid ester of the polyhydroxyphenol synthesized by the polycondensation of acetone and pyrogallol as is set forth in U.S. Pat. No. 3,635,709.

A photosensitive organic layer can be prepared by coating any of these o-quinone diazides alone or in conjunction with a resinous material on a support and drying. Suitable resinous materials used include alkali-soluble resins such as a phenol resin, a cresol resin, styrene/maleic anhydride copolymers, shellac, etc.

Since the thickness of the photosensitive organic coating of a photosensitive image forming material in the second embodiment of the present invention can be made thinner than that of conventionally known monolayer type materials, one can further employ resins, which are dissolved only with difficulty in alkalis, such as p-phenylphenol-formaldehyde resins, p-t-butyl-phenol-formaldehyde resins and other substituted phenol resins, e.g., bisphenol A-formaldehyde resins, or polyvinyl butyral. These components improve the mechanical strength of resulting image areas. In the case where an o-quinone diazide compound is blended with such a resin, the content of the o-quinone diazide compound is advantageously not lower than 20% by weight, based on the total weight of the o-quinone diazide and alkali-soluble resin. If the content of the o-quinone diazide is below 20% by weight, photosensitivity fails to reach an acceptable level and a sharp image is not provided.

The composition comprising an o-quinone diazide compound which is to form a photosensitive organic coating is dissolved in a suitable solvent or solvents for coating, suitable solvents including, for example, ethylene glycol monoalkyl ethers and their acetate esters such as ethylene glycol monomethyl ether, ethylene glycol monoethyl ether, ethylene glycol monomethyl ether acetate, ethylene glycol monoethyl ether acetate, etc., ketones such as methyl ethyl ketone, methyl isobutyl ketone, cyclohexanone, etc., butyl acetate, dioxane, pyridine, dimethylformamide, etc.

As has been mentioned hereinbefore, photosensitive members of the second embodiment of the present invention comprise a first photosensitive layer comprising an o-quinone diazide compound overcoated with a second photosensitive layer comprising a polyamide resin and an azide compound having an alkali-soluble group (the second layer corresponds per se to the photosensitive layer of the first embodiment of the photosensitive material of the present invention). In order to intensify adhesion between these two coatings, one may use a suitable silane coupling agent, e.g., γ-glycidoxypropyl-trimethoxysilane, β-(3,4-epoxycyclohexyl)-ethyltrimethoxysilane, etc., wherein the silane coupling agent is preferably incorporated in the coating mixture for the top coating. A suitable proportion of this agent is from 1 to 100% by weight, based on the polyamide.

The formation of a double layer structure for the second embodiment of a photosensitive material is carried out in a conventional manner by the repetition of coating and drying, but other techniques such as cast coating, transfer or simultaneous double coating can be employed, if desired. The formation of a single layer structure for the first embodiment of a photosensitive material is also carried out in a conventional manner, typically by dissolving the azide compound and the polyamide in a common solvent therefor and coating the resulting solution onto a support, followed by drying. Other techniques as exemplified above amenable to the formation of a single layer can also, of course, be used.

A suitable amount of each layer comprising the photosensitive image forming material of the present invention in the two-layer embodiment thereof is from about 0.01 g/m$^2$ to about 5.0 g/m$^2$, and the layer comprising the polyamide and azide compound is preferably coated in an amount of about 0.02 g/m$^2$ to 4.0 g/m$^2$ while the layer comprising o-quinonediazide compound is preferably coated in an amount of below 3.0 g/m$^2$, while the total coating amount from all organic coatings on the support should be below 7.0 g/m$^2$.

A photosensitive imaging member in accordance with the present invention is typically image-wise exposed by means of a mercury lamp, xenon lamp or carbon arc lamp and then developed.

One can employ those developer solutions which are conventionally used to develop photosensitive layers comprising o-quinone diazide compounds including aqueous solutions containing an inorganic alkali such as sodium hydroxide, potassium hydroxide, sodium silicate, potassium silicate, tert-sodium phosphate, tert-potassium phosphate, sodium carbonate, potassium carbonate, etc., and basic organic solvents such as ethanol amine. A typical developer solution used in the present invention is a 7 wt% aqueous sodium silicate solution. To promote permeation of the aqueous alkaline developer into areas which have been exposed to active radiation, about 0.1 to 10% by weight of an organic solvent such as, for example, n-propyl alcohol and/or about 0.1 to 5.0% by weight of a surface active agent such as sodium lauryl sulfate, sodium isopropylnaphthalenesulfonate, sodium dodecylbenzenesulfonate, etc. can be added to the developer at an appropriate concentration.

The photosensitive member of the present invention can be used not only for the preparation of printing masters but for other uses such as the production of a name plate, transparencies for overhead projectors, etc.

The present invention will be illustrated in more detail by several examples of preferred embodiments of the present invention.

EXAMPLE 1

Five parts by weight of an alcohol soluble nylon resin ("Elvamide #8061" manufactured by E.I. duPont Co.) was dissolved in 100 parts by weight of a solvent mixture comprising equel weights of n-propyl alcohol and methyl alcohol heated to about 70° C. The resulting solution was cooled to about 25° C. and then 0.5 part by weight of 4,4'-diazide-2,2'-disulfonic acid sodium salt and 0.2 part by weight of a dyestuff (Oil Blue manufactured by Orient Chemical Co. (C.I.74,350)) added thereto. The mixture was coated on a 0.3 mm thick aluminum plate which had been subjected to graining and subsequent anodic oxydation (current density; 1.6 amp/dm$^2$, period; 2 min, electrolysis bath; 15% by weight sulfuric acid) to give a dry coating weight of 1.5 g/m$^2$.

A positive transparency was contacted therewith and the thus prepared photosensitive plate was exposed to a PS Light (provided with a 3 KW light source from Toshiba, Metal Halide lamp JU 2000-2-OL type; sold by Fuji Photo Film Co., Ltd.) at a distance of 1 m for 20 sec.

Development was then carried out by immersing the exposed plate in an aqueous solution containing 7 weight % sodium silicate and 2.5 weight % n-propyl alcohol for about 2 min at room temperature, and then by brushing the plate with a nylon brush, whereby exposed areas were removed. The resulting positive image bearing plate, used as printing master, showed superior abrasion resistance as well as a remarkable resistance to organic solvents.

EXAMPLE 2

4 parts by weight of an ester of a polyhydroxyphenyl (condensation product of acetone and pyrogallol as described in Example 1 of U.S. Pat. No. 3,635,709) and naphthoquinone-1,2-diazide-5-sulfonic acid and 4 parts by weight of a novolak type cresol-formaldehyde resin were dissolved in 100 parts by weight of an ethylene glycol monomethyl ether. The thus prepared solution was coated onto an aluminum plate which had been grained and anodized as in Example 1. The coating amount was 1.5 g/m$^2$ after drying. The photosensitive coating mixture set forth in Example 1 was overcoated on the above prepared o-quinone diazide coating so as to give a dried thickness of 1.2 g/m$^2$.

The photosensitive plate thus prepared was exposed to light through a positive transparency using a PS Light as described in Example 1 at a distance of 1 m for 50 sec. The plate was then immersed in the aqueous alkaline solution described in Example 1 for 1 min. at room temperature. After the immersion, the plate was lightly rubbed with a brush while horizontal. The exposed areas of the coating were readily removed to give a clear and distinct positive reproduction of the original image. The image thus formed, exhibiting superior abrasion as well as scratch resistance due to the polyamide resin involved, with stood lithographic printing for over 200,000 runs, giving high quality prints. When the top coating of the invention was omitted (only the photosensitive coating of the o-quinone diazide layer was used), the image areas wore out after 100,000 runs.

EXAMPLE 3

5 parts by weight of an alcohol soluble nylon resin (marketed by Toray Co. under the trade name "Amilan CM4000") was dissolved in 80 parts by weight of methanol while heating at the boiling point of methanol. After cooling, 0.4 part by weight of 4,4'-diazidestilbene-2,2'-disulfonic acid sodium salt and 0.3 part by weight of a dye (trade name "Oil Blue", marketed by Orient Chemical Co.) were further dissolved therein. The resulting solution was coated on a polyethylene terephthalate film having a matt surface and a thickness of 0.1 mm to give a dried coating weight of about 1.5 g/m$^2$. When this photosensitive film was processed as described in Example 1, i.e., exposed and developed, a transparent sheet bearing therein a blue colored image was obtained, which could be used as a photographic original.

EXAMPLE 4

A result similar to that of Example 3 was obtained when the nylon resin "Amilan CM4000" used in Example 3 was replaced with the alcohol soluble nylon "Zytel" (E.I. du Pont Co.).

EXAMPLE 5

5 parts by weight of an alcohol soluble nylon resin ("Amilan CM4000" of Toray Co.) was dissolved in 100 parts by weight of a 1:1 mixture of propyl alcohol and methyl alcohol, while heating at the boiling point of the solvent mixture. After cooling, 0.4 part by weight of the phenylhydrazine salt of 4-diazidebenzene sulfonic acid, 0.4 part by weight of 1-methyl-2-benzoylmethylene-$\beta$-naphthothiazoline, 0.2 part by weight of a dye ("Oil Blue" from the Orient Chemical Co.) were further dissolved therein. An aluminum plate treated as in Example 1 was coated with this coating mixture and dried to provide a coating in an amount of 1.5 g/m$^2$ (dry basis). A highly durable positive image was obtained when processed in as in the preceeding examples.

EXAMPLE 6

The coating mixture set forth in Example 5 was overcoated on the o-quinone diazide photosensitive coating utilized in Example 2, which had been provided on a grained and anodized aluminum plate as in Example 2, to give a dried coating weight of 1.0 g/m$^2$. The resulting photosensitive plate worked satisfactorily as a long run offset printing master having a durable image.

EXAMPLE 7

Example 5 was repeated with the replacement of the phenylhydrazine salt of 4-azidebenzene sulfonic acid with 4-azidebenzene carboxylic acid. The resulting plate exhibited superior performance as a positive type photosensitive plate as did the composition of Example 5.

While the invention has been described in detail and with reference to specific embodiments thereof, it will be apparent to one skilled in the art that various changes and modifications can be made therein without departing from the spirit and scope thereof.

What is claimed is:

1. A process for forming positive images which consists essentially of imagewise exposing to actinic light a photosensitive image forming element comprising:
   a support;
   a first photosensitive layer comprising an o-quinone diazide compound provided on said support; and
   a second photosensitive layer which is substantially alkali insoluble directly overcoated on said first photosensitive layer, said second photosensitive layer being a homogeneous film rendered alkali-soluble upon exposure to actinic light and consisting essentially of in quantities sufficient to form an image upon development, as separate ingredients;
   (i) an aryl azide compound having one or two aryl groups and at least one alkali-soluble group selected from the group consisting of a sulfonic acid group, a carboxylic acid group, and a hydroxyl group, and the alkali metal salts thereof in its molecular structure, and
   (ii) a polyamide soluble in a lower alcohol, said polyamide and azide compound capable of co-acting to render areas exposed with actinic light alkali-soluble while unexposed area remain alkali-insoluble, and thereafter selectively dissolving said exposed areas in an alkaline medium.

2. The process of claim 1, wherein said aryl azide comprises a maximum of 2 azide groups.

3. The process of claim 1, wherein said azide is selected from the group consisting of 4-azidebenzenesulfonic acid, 4-azidebenzenecarboxylic acid and sodium 4,4'-diazidestilbene-2,2'-disulfonate.

4. The process of claim 1, wherein said polyamide and said azide compound are soluble in the same solvent.

5. The process of claim 4, wherein said solvent is a lower alkanol.

6. The process of claim 4, wherein said solvent is dimethylformamide.

7. The process of claim 1, wherein from about 3 to about 30 parts by weight of said azide is present per 100 parts by weight of said polyamide and said first layer contains more than 20% by weight of said quinone diazide compound.

8. The process of claim 1, wherein said first and second photosensitive layers are each present in an amount of about 0.01 to about 5.0 g/m$^2$, dry basis.

9. The process of claim 8, wherein the layer comprising the nylon copolymer and azide compound is coated in an amount of about 0.02 g/m$^2$ to 4.0 g/m$^2$ and the layer comprising the o-quinone diazide compound is coated in an amount of below 3.0 g/m$^2$.

10. The process of claim 1, wherein said polyamide has a molecular weight of from about 1,000 to 50,000.

11. The process of claim 1, wherein said second photosensitive layer further contains a silane coupling agent in an amount from 1 to 100% by weight, based on said polyamide.

12. The process of claim 11, wherein said silane coupling agent is $\gamma$-glycidoxypropyltrimethoxy-siloxane or $\beta$-(3,4-epoxycyclohexyl)-ethyltrimethoxysilane.

* * * * *